United States Patent
Wan et al.

(10) Patent No.: US 6,955,984 B2
(45) Date of Patent: Oct. 18, 2005

(54) SURFACE TREATMENT OF METAL INTERCONNECT LINES

(75) Inventors: Wen-Kai Wan, Hsin-Chu (TW); Yih-Hsiung Lin, Sanchung (TW); Ming-Dai Lei, Hsin-Chu (TW); Baw-Ching Perng, Hsin-Chu (TW); Cheng-Chung Lin, Taipei (TW); Chia-Hui Lin, Hsin-Chu (TW); Ai-Sen Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 74 days.

(21) Appl. No.: 10/439,358

(22) Filed: May 16, 2003

(65) Prior Publication Data

US 2004/0229460 A1 Nov. 18, 2004

(51) Int. Cl.[7] .............................................. H01L 21/44
(52) U.S. Cl. ........................ 438/678; 438/597; 438/687
(58) Field of Search ................................ 438/678, 597, 438/687, 686

(56) References Cited

U.S. PATENT DOCUMENTS

| | | | |
|---|---|---|---|
| 4,397,812 A | * | 8/1983 | Mallory, Jr. ................ 420/441 |
| 5,261,950 A | | 11/1993 | Morikawa et al. |
| 5,380,546 A | | 1/1995 | Krishnan et al. |
| 5,680,092 A | * | 10/1997 | Yamada et al. ............. 338/309 |
| 6,020,021 A | * | 2/2000 | Mallory, Jr. ................ 427/125 |
| 6,130,157 A | | 10/2000 | Liu et al. |
| 6,225,210 B1 | | 5/2001 | Ngo et al. |
| 6,339,025 B1 | | 1/2002 | Liu et al. |
| 6,342,733 B1 | | 1/2002 | Hu et al. |
| 6,368,948 B1 | | 4/2002 | Ngo et al. |
| 6,383,925 B1 | | 5/2002 | Ngo et al. |
| 6,406,996 B1 | | 6/2002 | Bernard et al. |
| 6,410,426 B1 | | 6/2002 | Xing et al. |
| 6,432,822 B1 | | 8/2002 | Ngo et al. |
| 6,500,749 B1 | | 12/2002 | Liu et al. |
| 6,509,267 B1 | | 1/2003 | Woo et al. |
| 6,605,874 B2 | * | 8/2003 | Leu et al. ................... 257/758 |

OTHER PUBLICATIONS

Saito, T., et al., "A Novel Copper Interconnection Technology Using Self Aligned Metal Capping Method," IEEE (Jun. 2001) pp. 15–17.

* cited by examiner

Primary Examiner—Brad Smith
(74) Attorney, Agent, or Firm—Slater & Matsil, L.L.P.

(57) ABSTRACT

Methods and apparatus for forming a semiconductor structure comprising a first layer on top of a substrate wherein the first layer defines conductive regions such as copper interconnect lines and non-conductive regions such as dielectric materials. The conductive regions are covered by a second layer of a material different than the first layer such as for example nickel and then the structure is heat treated such that the interconnect lines and second metal, such as a copper interconnect line and a nickel second layer, interact with each other to form an alloy layer. The alloy layer has superior qualities for adhering to both the copper interconnect lines and a subsequently deposited dielectric material.

34 Claims, 1 Drawing Sheet

SURFACE TREATMENT OF METAL INTERCONNECT LINES

TECHNICAL FIELD

The present invention relates generally to the use of a capping layer over conductors formed by a Damascene etch scheme, and more particularly to the use of forming an alloy layer comprised of metal from the metal conductors deposited by the Damascene process and a second metal formed over the conductors or leads.

BACKGROUND

As is well known by those skilled in the art, a continuing goal in manufacturing and production of semiconductors is a reduction in size of components and circuits with the concurrent result of an increase in the number of circuits and/or circuit elements such as transistors, capacitors, etc., on a single semiconductor device. This relentless and successful reduction in size of the circuit elements has also required reduction in the size of the conductive lines connecting devices and circuits. However, as the conducting lines are designed to be smaller and smaller, the resistance of the interconnects increases. Further, as the number of dielectric layers increases, the capacitive coupling between lines on the same level and adjacent level increases.

In the past, aluminum was used as the metal interconnect lines and silicon oxide as the dielectric. However, newer manufacturing techniques now favor copper as the metal for interconnect lines and various low K materials (organic and inorganic) are favored as the dielectric material. Not surprisingly, these material changes have required changes in the processing methods. In particular, because of the difficulty of etching copper without also causing unacceptable damage to the dielectric material, the technique of forming the metal interconnect lines has experienced significant changes. Namely, whereas aluminum interconnects could be formed by depositing a layer of aluminum and then using photoresist, lithography, and etching to leave a desired pattern of aluminum lines, the formation of copper interconnect lines are typically formed by a process now commonly referred to as a Damascene process. The Damascene process is almost the reverse of etching, and simply stated a trench, canal or via is cut, etched or otherwise formed in the underlying dielectric and is then filled with metal (i.e., copper).

Unfortunately, although copper has the advantages discussed above, it readily diffuses into dielectric material used in the manufacture of semiconductor devices, and it diffuses especially easily into silicon dioxide. Diffusion of copper into the dielectric materials of a semiconductor deice can cause serious reliability problems including electrical shorts. Therefore, it is typical to form a barrier layer between the copper used for conductors and leads and the dielectric material of a semiconductor device. Typical barrier layers may be formed of Ta (tantalum), TaN (tantalum nitride), Ti (titanium), TiN (titanium nitride) and various combinations of these metals as well as other metal. The barrier layer is typically formed on the bottom and sidewalls of the trenches and vias of the copper interconnects to prevent the copper from diffusing into the surrounding silicon dioxide as other dielectric material. A layer of silicon nitride is then typically deposited as a cover layer over the complete structure including the conductor areas and the dielectric layer before another layer or level of dielectric structure is deposited.

Unfortunately, silicon nitride adheres poorly to copper and may peel away thereby creating poor interface properties including a path for copper to diffuse into the subsequent or cover layer of dielectric material. The same path may also allow moisture and contaminants to diffuse from outside into the copper so as to form porous copper oxide.

Various ones of the above-mentioned problems have been addressed by the prior art, but none of the known prior art provides a solution to all of the problems in the simple and elegant method provided by the present invention. For example, U.S. Pat. No. 5,380,546, entitled "Multilevel Metallization Process for Electronic Components" and issued to Krishnan, et al., teaches the use of tungsten as both a barrier layer and a capping layer, but does not teach the unique method of forming an alloy as taught by the present invention. U.S. Pat. No. 6,130,157, entitled "Method to Form an Encapsulation Layer Over Copper Interconnects" issued to Liu, et al., teaches the use of several metals as a barrier layer and "treats" a tungsten capping layer with a nitrogen plasma, but does not teach nickel as the capping layer or simply heating to form an alloy as taught by the method of the present invention. U.S. Pat. No. 6,261,950, entitled "Self-Aligned Metal Caps for Interlevel Metal Connections" issued to Tobben, et al., does not teach the use of a barrier layer and teaches a first embodiment that selectively deposits a capping layer, but does not teach forming an alloy. The '950 patent also teaches a second embodiment that does not selectively deposit a second metal but does include a heat treatment although at a greater temperature than the present invention. A paper by T. Saito, et al., in proceedings of the IITC in 2001 at pages 15–17 teaches a self aligned metal capping process for Copper damascene interconnect. A Tungsten capping layer is selectively formed on the Cu interconnect using the preferential deposition phenomenon of W-CVD assisted by pre and post treatment. This technology is applied to 0.2 $\mu$m bipolar-CMOS LSI with multilevel Cu interconnects, and then yield, reliability and operation speed are evaluated.

SUMMARY OF THE INVENTION

These and other problems are generally solved or circumvented, and technical advantages are generally achieved, by the present invention which discloses methods and apparatus for forming a semiconductor structure comprising a first layer comprised of conductive regions such as copper or other metal interconnect lines and non-conductive regions such as a silicon dioxide dielectric or other non-conductive materials. A layer of a second metal that is different from the metal of the conductive regions is formed or deposited on the conductive region such as by a electro-chemical deposition process including electroless plating. The electroless plating may be carried out by placing the substrate with the conductive and non-conductive region into a electroless plating chemical bath comprised of a metal ion chelate (such as a Ni (nickel ion chelate), a reduction agent such as sodium hypophosphite or Hydrazine and, if necessary, one or more agents or additives such as the accelerator sodium adipate, etc. The substrate including the layer of a first metal formed as the conductive region and the second metal of the cover layer interact to form an alloy such as for example, a copper/nickel (Cu/Ni) alloy. The surface of the second Cu/Ni layer is then cleaned by one or more various cleaning processes well known by those skilled in the art.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
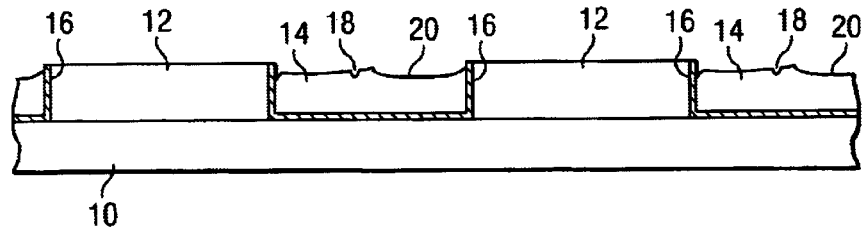
FIG. 1 is a prior art illustration of a semiconductor structure comprising a substrate covered by conductive regions and non-conductive regions.

Referring now to FIG. 1, there is shown a typical semiconductor structure including a substrate 10 having a first layer of non-conductive regions 12 and conductive or interconnect regions 14. It should be appreciated that the term substrate 10 as used herein may simply be a silicon wafer or alternately may represent one or more layers of various semiconductor devices including interconnecting metalization layers. Thus, the term substrate is intended to be broadly interpreted. For example, typically the substrate 10 may be comprised of a dielectric layer similar to the non-conductive regions 12 of FIG. 1.

As is well known by those skilled in the art, the use of the Damascene process and the use of copper as the interconnecting layers has created new problems while at the same time solving other problems. For example, when the conducting or interconnecting lines are made of copper, the copper may diffuse into the surrounding non-conductive or substrate areas if steps are not taken to prevent such diffusion. Thus, as shown in FIG. 1 there is also included a barrier layer 16, which stops or hinders the diffusion of the copper ions from the copper interconnecting strip 14 into the surrounding non-conductive portions or regions 12 and the substrate 10. Suitable barrier layers are well known in the art and include, for example only, Ta (tantalum), TaN (tantalum nitride), Ti (titanium) and TiN (titanium nitride) and various combinations of these and other materials. Thus, when this barrier layer 16 is provided, diffusion of the copper into the surrounding materials is slowed if not substantially eliminated. Further, it is typical to include a cover layer over the non-conductive regions 12 and the conductive regions 14 of a material such as silicon nitride if still another layer of semiconductor devices is to be formed over the first layer 12 and 14. Unfortunately, as was discussed above, the silicon nitride does not adhere well to the copper interconnect line which will typically have been subjected to CMP. Further, the conductive layer such as a layer of copper may include rough areas with pockets such as pocket 18 and/or dish areas such as dish area 20. Thus, because of the poor adhesion qualities between the copper and the protective layer of silicon nitride, it is not uncommon for serious reliability problems to occur. For example, the layer of silicon nitride (not shown) may peel away leaving no barrier between the copper and the subsequent dielectric layer. Of course as will be appreciated by those skilled in the art, when the barrier of silicon nitride is absent, the copper ions will readily diffuse into the cover layer of a dielectric thereby often causing electrical shorts.

Figure 2A:
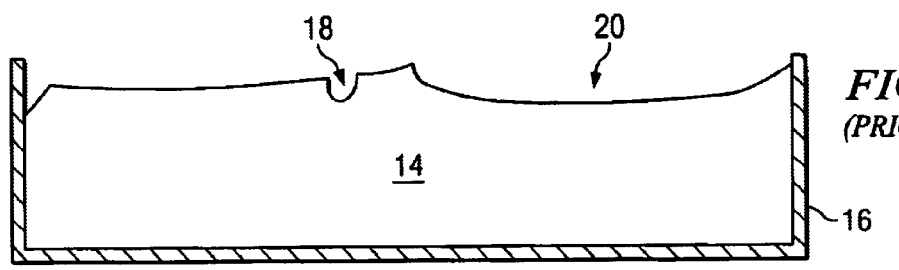
FIG. 2A is an enlarged view of conductive regions of FIG. 1.
Figure 2B:
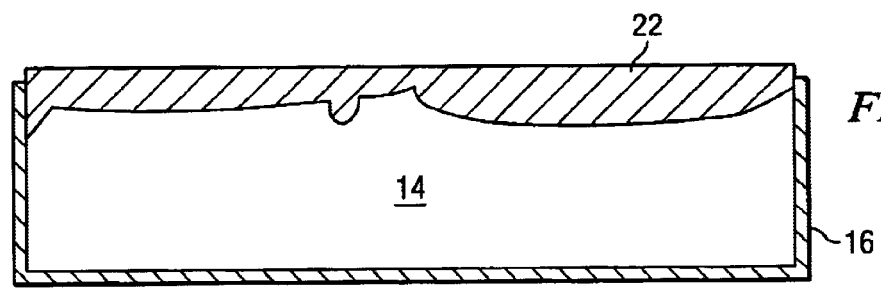
FIG. 2B illustrates the view of FIG. 1 after a second metal has been formed over the conductive regions according to the teachings of this invention.
Figure 2C:
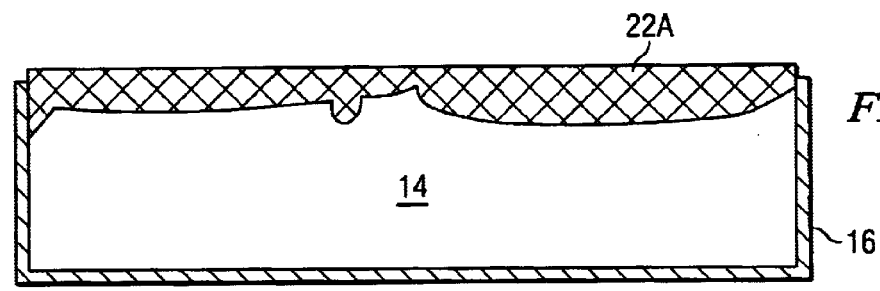
FIG. 2C illustrates the structure of FIG. 2B after heating the semiconductive structure so as to cause the metal of the conductive regions and the second metal to react with each other to form an alloy.

Referring now to FIG. 2A, there is illustrated an enlarged view of the conductive region or copper interconnect line 14 prior to the processes of the present invention. Therefore, according to the invention a second metal or layer of metal material is deposited over the metal interconnect or copper line 14 such as by electrochemical depositing a metal capping layer which will adhere only to the conductive regions or copper interconnect lines. To form the second layer of metal which adheres to the conductive regions or copper interconnect lines, an electroless plating process, such as ECD (Electroless Chemical Deposition) may be used which includes providing a solution of $NiCH_2$ and $H_2O$ or $NiSO_4$ and $H_2O$. According to another embodiment, an electrolyte solution or chemical bath may be used which includes a metal ion chelate such as for example a nickel ion chelate in the form of EDTA (ethylenediamine tetra-acetic acid) or a citric acid solution, a reduction agent such as for example Sodium Hypophosphite ($Na(H_2PO_2)$ $H_2O$) or Hydrazine, and one or more additives. It may be desirable to use several additives for different purposes. For example, sodium adipate may be used as an accelerator, thiourea as a stabilizer, sodium carbonate or ammonia as a pH adjustor and ABS-Na as a brightener. Thus, by using the ECD process or an electrolyte solution for electroless depositing, a second metal, such as nickel, onto the surface of the copper interconnect lines 14, a second layer 22 of the second metal is formed over the copper interconnect lines 14. The combined semiconductor structure of the substrate, the layer of non-conductive region (or dielectric) and conductive regions (copper interconnect lines), and the second metal capping layer 22 formed of another metal different from copper, such as for example nickel, is then subjected to a heat treatment such as a sintering temperature of between 300° and 400° C. This heat treatment will cause an inter reaction between the two metals such as for example the copper and interconnect lines 14 and the deposited nickel 22 to form an alloy layer 22a of the two metals or Cu/Ni. The resulting alloy layer 22a will have improved adhesion with respect to a subsequent dielectric layer and excellent adhering qualities with respect to the copper interconnect line 14 thereby eliminating the tendency of the silicon nitride to peel and further reducing the reliability problems. Other metals suitable for use as the metal capping layer include Co (cobalt) and Pd (palladium). The structure is then preferably cleaned by a standard post CMP cleaning process.

Figure 2D:
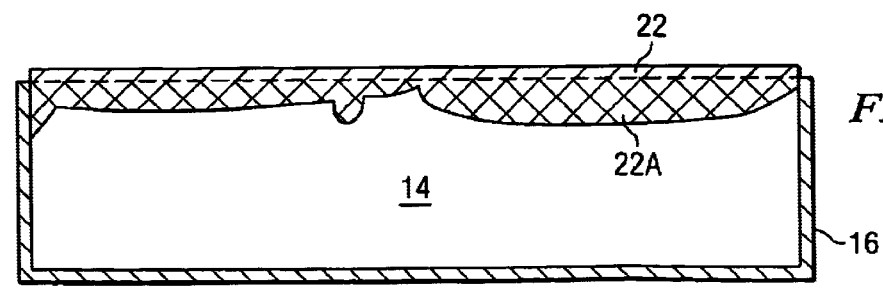
FIG. 2D illustrates an alternate embodiment of FIG. 2C wherein the thickness of the second metal layer was greater than the depth of the copper ion migration such that there is an alloy layer and a top layer of the second metal.

If the second metal layer is thick enough, or the heat treatment is of too short a duration, the copper ion migration into the second metal layer, (such as nickel), may not reach the top portions of the layer so that the top portion is comprised substantially of nickel alone without copper ions. In this situation, the combined structure will comprise the copper interconnect lines 14, an alloy layer 22a and a second metal layer 22 such as shown in FIG. 2D.

Although the present invention and its advantages have been described in detail, it should be understood that various changes, substitutions and alterations can be made herein without departing from the spirit and scope of the invention as defined by the appended claims. For example, it will be readily understood by those skilled in the art that dimensions and layer thickness may be varied while remaining within the scope of the present invention.

Moreover, the scope of the present application is not intended to be limited to the particular embodiments of the process, methods and steps described in the specification. As one of ordinary skill in the art will readily appreciate from the disclosure of the present invention, processes, methods, or steps, presently existing or later to be developed, that perform substantially the same function or achieve substantially the same result as the corresponding embodiments described herein may be utilized according to the present invention. Accordingly, the appended claims are intended to include within their scope such processes, methods, or steps.

What is claimed is:

1. A method of forming a semiconductor structure comprising the steps of:
   forming a first layer over a substrate, said first layer having conductive regions of a first metal and non-conductive regions;
   electrochemically depositing (ECD) a second layer on said conductive regions of said first layer, said second layer being a second metal different than said first metal; and
   heating said first layer and said second layer to a temperature of between about 300° C. and 400° C. to form an alloy of said first metal and said second metal.

2. The method of claim 1 further comprising the step of cleaning the exposed surface of said second layer of said structure prior to said heating step.

3. The method of claim 1 further comprising the step of forming a barrier layer between said conductive regions and said non-conductive regions.

4. The method of claim 1 wherein one of the solutions $NiCl_2$, and $H_2O$ and $NiSO_4$, and $H_2O$ is used for said ECD process.

5. The method of claim 1 wherein said first metal is copper.

6. The method of claim 5 wherein said second metal is selected from the group consisting of Ni (nickel), Co (cobalt) and Pd (palladium).

7. The method of claim 1 wherein said second metal is nickel.

8. A method of forming a semiconductor structure comprising the steps of:
   forming a first layer over a substrate, said first layer having non-conductive regions and conductive regions of a first metal;
   electroless plating a second layer on said conductive regions of said first layer, said second layer being a second metal different than said first metal; and
   heating said first layer and said second layer to a temperature of between about 300° C. and 400° C. to form an alloy of said first metal and said second metal.

9. The method of claim 8 wherein said first metal is copper.

10. The method of claim 9 wherein said second metal is selected from the group consisting of Ni (nickel), Co (cobalt) and Pd (palladium).

11. The method of claim 8 wherein said second metal is nickel.

12. The method of claim 8 wherein said step of electroless plating said second layer on said conductive regions of said first layer comprises the steps of providing a chemical bath of a metal ion chelate and a reduction agent.

13. The method of claim 12 wherein said metal ion chelate comprises a nickel ion chelate.

14. The method of claim 12 wherein said reduction agent is selected from the group consisting of sodium hypophosphite ($Na(H_2PO_2)$ $H_2O$) and hydrazine.

15. The method of claim 12 further comprising at least one additive selected from the group consisting of an accelerator (sodium adipate), a stabilizer (thiourea), a pH adjuster (sodium carbonate and ammonia), and a brightener (ABS-Na).

16. The method of claim 8 further comprising the step of forming a barrier layer between said conductive regions and said non-conductive regions.

17. A method of forming a semiconductor structure comprising the steps of:
   forming a first layer over a substrate, said first layer comprising conductive regions containing copper and non-conductive regions;
   forming a layer of nickel over said conductive regions;
   heating said copper layer and said nickel layer to a temperature of between about 300° C. and 400° C. to form an alloy layer of copper and nickel.

18. The method of claim 17 wherein said step of forming said nickel layer on said copper layer comprises the step of using an ECD process for electrochemically depositing said nickel layer over said copper layer.

19. The method of claim 18 wherein one of the solutions $NiCl_2$ and $H_2O$ and $NiSO_4$ and $H_2O$ is used for said ECD process.

20. The method of claim 17 wherein said step of forming said layer of nickel comprises the step of electroless plating nickel on said conductive regions.

21. The method of claim 20 wherein said step of an electroless plating process comprising the step of providing a chemical bath of a nickel ion chelate and a reduction agent.

22. The method of claim 21 wherein said reduction agent is selected from the group consisting of sodium hypophosphite ($Na(H_2PO_2)$ $H_2O$) and hydrazine.

23. The method of claim 21 further comprising at least one additive selected from the group consisting of an accelerator (sodium adipate), a stabilizer (thiourea), a pH adjuster (sodium carbonate and ammonia), and a brightener (ABS-Na).

24. A method of capping interconnect lines to reduce metal diffusion from said interconnect lines into surrounding material comprising the steps of:
   depositing a layer of non-conductive material over a substrate;
   forming interconnect lines in said layer of non-conductive material by a damascene process, said interconnect lines comprising a first metal;
   forming a second metal over said interconnect lines, said second metal different than said first metal; and
   heating said first layer and said second layer heating to a temperature of between about 300°C. and 400°C. to form a layer of an alloy comprising said first metal and said second metal over said interconnect lines.

25. The method of claim 24 further comprising forming a layer of semiconductor devices over said capped interconnect lines and said non-conductive material.

26. The method of claim 25 further comprising a layer of silicon nitride formed between said capped interconnect lines and said layer of semiconductor devices.

27. The method of claim 24 wherein the process of forming a capping layer of a second metal is a process selected from electrochemical deposition and electroless plating.

28. The method of claim 24 wherein said first metal is copper.

29. The method of claim 24 where said second metal is selected form the group consisting of Ni (nickel), Co (cobalt), and Pd (palladium).

30. The method of claim 24 wherein said step of electroless plating said second layer on said conductive regions of said first layer comprises the steps of providing a chemical bath of a metal ion chelate and a reduction agent.

31. The method of claim 30 wherein said metal ion chelate comprises a nickel ion chelate.

32. The method of claim 30 wherein said reduction agent is selected from the group consisting of sodium hypophosphite ($Na(H_2PO_2) \cdot H_2O$) and hydrazine.

33. The method of claim 30 further comprising at least one additive selected from the group consisting of an accelerator (sodium adipate), a stabilizer (thiourea), a pH adjuster (sodium carbonate and ammonia), and a brightener (ABS-Na).

34. The method of claim 24 further comprising the step of forming a barrier layer between said interconnect lines and said non-conductive material.

* * * * *